United States Patent
Liu et al.

(10) Patent No.: US 11,746,252 B2
(45) Date of Patent: Sep. 5, 2023

(54) COMPOSITION, COATING, COATING FILM, BACK SHEET FOR SOLAR CELL MODULE AND SOLAR CELL MODULE

(71) Applicants: DAIKIN FLUOROCHEMICALS (CHINA) CO., LTD., Jiangsu (CN); DAIKIN INDUSTRIES, LTD., Osaka (JP)

(72) Inventors: Weiwei Liu, Jiangsu (CN); Hideto Nakagawa, Jiangsu (CN); Masaru Nagato, Osaka (JP)

(73) Assignees: DAIKIN FLUOROCHEMICALS (CHINA) CO., LTD., Jiangsu (CN); DAIKIN INDUSTRIES, LTD., Osaka (JP)

( * ) Notice: Subject to any disclaimer, the term of this patent is extended or adjusted under 35 U.S.C. 154(b) by 294 days.

(21) Appl. No.: 16/766,313

(22) PCT Filed: Nov. 20, 2018

(86) PCT No.: PCT/CN2018/116412
§ 371 (c)(1),
(2) Date: May 22, 2020

(87) PCT Pub. No.: WO2019/101065
PCT Pub. Date: May 31, 2019

(65) Prior Publication Data
US 2020/0392363 A1    Dec. 17, 2020

(30) Foreign Application Priority Data
Nov. 24, 2017 (CN) .......................... 201711191440.X (51) Int. Cl.
*C09D 127/18* (2006.01)
*H01L 31/049* (2014.01)
(Continued)

(52) U.S. Cl.
CPC ............. *C09D 127/18* (2013.01); *C09D 7/48* (2018.01); *C09D 7/61* (2018.01); *H01L 31/049* (2014.12); *H01L 31/0481* (2013.01)

(58) Field of Classification Search
CPC ............. H01L 31/048–049; C09D 127/12–20
See application file for complete search history.

(56) References Cited

U.S. PATENT DOCUMENTS

| | | | |
|---|---|---|---|
| 2008/0008838 A1 | 1/2008 | Arpac et al. | |
| 2012/0301728 A1* | 11/2012 | Saito | C08G 18/718 524/544 |

(Continued)

FOREIGN PATENT DOCUMENTS

| | | |
|---|---|---|
| CA | 2 980 691 A1 | 10/2016 |
| CN | 1637087 A | 7/2005 |

(Continued)

OTHER PUBLICATIONS

International Search Report for PCT/CN2018/116412 dated Jan. 30, 2019 (PCT/ISA/210).

(Continued)

*Primary Examiner* — Ryan S Cannon
(74) *Attorney, Agent, or Firm* — Sughrue Mion, PLLC (57) ABSTRACT

A composition containing a fluorine-containing polymer having a curable functional group and a pentamethylene diisocyanate-based curing agent. Also disclosed is a coating film obtained from the composition; a laminate including a substrate and a layer obtained from the composition; a back sheet for a solar cell module having a water-impermeable sheet and a coating film obtained from the composition, the coating film being formed on at least one side of the water-impermeable sheet; and a solar cell module having a water-impermeable sheet and a coating film obtained from the composition, the coating film being formed on at least (Continued)

one side of the water-impermeable sheet, and a sealant layer formed above the coating film.

11 Claims, 1 Drawing Sheet

(51) Int. Cl.
*C09D 7/61* (2018.01)
*C09D 7/48* (2018.01)
*H01L 31/048* (2014.01)

(56) References Cited

U.S. PATENT DOCUMENTS

| | | |
|---|---|---|
| 2013/0338330 A1 | 12/2013 | Nakagawa et al. |
| 2017/0166772 A1* | 6/2017 | Nalewajek ............... C09D 7/20 |
| 2018/0079187 A1 | 3/2018 | Satoh |
| 2020/0040211 A1* | 2/2020 | Saito ................... C08F 214/182 |
| 2020/0157372 A1 | 5/2020 | Fukuda et al. |

FOREIGN PATENT DOCUMENTS

| | | | |
|---|---|---|---|
| CN | 107250306 A * | 10/2017 | ............ B32B 27/08 |
| CN | 107250306 A | 10/2017 | |
| EP | 1 938 967 A1 | 7/2008 | |
| JP | 2007-035694 A | 2/2007 | |
| JP | 2007-526366 A | 9/2007 | |
| JP | 2011-162598 A | 8/2011 | |
| WO | WO-2011096306 A1 * | 8/2011 | ......... C08K 5/34924 |
| WO | 2012/121291 A1 | 9/2012 | |
| WO | 2018/193926 A | 10/2018 | |

OTHER PUBLICATIONS

International Preliminary Report on Patentability with the translation of Written Opinion dated May 26, 2020, from the International Bureau in International Application No. PCT/CN2018/116412.

* cited by examiner

COMPOSITION, COATING, COATING FILM, BACK SHEET FOR SOLAR CELL MODULE AND SOLAR CELL MODULE

CROSS REFERENCE TO RELATED APPLICATIONS

This application is a National Stage of International Application No. PCT/CN2018/116412 filed Nov. 20, 2018, claiming priority based on Chinese Patent Application No. 201711191440.X, filed Nov. 24, 2017.

TECHNICAL FIELD

The present invention relates to a composition, a coating, a coating film, a back sheet for a solar cell module and a solar cell module. More specifically, the present invention relates to a composition suitable for coating on a back sheet for a solar cell module, a coating film obtained from the composition, and a back sheet for a solar cell module and a solar cell module having the coating film.

BACKGROUND ART

A solar cell module is generally composed of a surface layer, a sealant layer sealing the solar cell, and a back sheet. As the sealant for forming the sealant layer, a copolymer of ethylene and vinyl acetate (hereinafter also referred to as EVA) is typically used.

For example, Patent Document 1 discloses a back sheet for a solar cell module, which is obtained by forming a cured coating film of a fluorine-containing polymer coating containing a curable functional group on at least one side of a water-impermeable sheet.

PRIOR ART DOCUMENT

Patent Document
Patent Document 1: Japanese Laid-Open Publication No. 2007-35694

SUMMARY OF INVENTION

Problem to be Solved by the Invention

The present invention aims to provide a composition capable of forming a coating film with good adhesion to a substrate even after a pressure cooker test, a coating film obtained from the composition, and a back sheet for a solar cell module and a solar cell module having the coating film.

Solution to Problem

The present invention relates to a composition, characterized in comprising a fluorine-containing polymer containing a curable functional group and a pentamethylene diisocyanate-based curing agent.

In addition, the present invention also relates to a coating film, characterized in being obtained from the above-mentioned composition.

The present invention further relates to a laminate, characterized in comprising: a substrate, and a layer obtained from the above-mentioned composition In addition, the present invention also relates to a back sheet for a solar cell module, characterized in having a water-impermeable sheet and a coating film formed on at least one side of the water-impermeable sheet, the coating film being obtained from the above-mentioned composition.

In addition, the present invention also relates to a solar cell module, characterized in having a water-impermeable sheet, a coating film formed on at least one side of the water-impermeable sheet, and a sealant layer formed above the coating film, the coating film being obtained from the above-mentioned composition.

The present invention will be described in detail below.

The composition of the present invention comprises a fluorine-containing polymer containing a curable functional group.

As the fluorine-containing polymer containing a curable functional group, a polymer formed by introducing a curable functional group into a fluorine-containing polymer may be mentioned. It should be noted that the fluorine-containing polymer containing a curable functional group includes a resinous polymer having a sharp melting point, an elastomeric polymer exhibiting rubber elasticity, and a thermoplastic elastomeric polymer between them.

A functional group imparting the fluorine-containing polymer with curability may be appropriately selected in view of ease of production of the polymer or a curing system, and for example, a hydroxyl group (excluding the hydroxyl group contained in the carboxyl group, the same applies hereinafter), a carboxyl group, a group represented by —COOCO—, a cyano group, an amino group, an epoxy group, a silyl group and the like may be mentioned. Among them, from the viewpoint of good curing reactivity, it is preferably at least one group selected from the group consisting of a hydroxyl group, a carboxyl group, a group represented by —COOCO—, an amino group, a cyano group, and a silyl group, more preferably at least one group selected from the group consisting of a hydroxyl group, a carboxyl group, an amino group and a silyl group, further preferably at least one group selected from the group consisting of a hydroxyl group, a carboxyl group and an amino group, and particularly preferably at least one group selected from the group consisting of a hydroxyl group, and a carboxyl group. These curable functional groups are usually introduced into the fluorine-containing polymer by copolymerization of a curable functional group-containing monomer.

As the curable functional group-containing monomer, for example, a hydroxyl group-containing monomer, a carboxyl group-containing monomer, an amino group-containing monomer and a silicone-based vinyl monomer may be mentioned, and one, or two or more of them may be used.

The fluorine-containing polymer containing a curable functional group preferably contains a polymeric unit based on a fluorine-containing monomer and a polymeric unit based on a curable functional group-containing monomer, and the curable functional group-containing monomer is at least one selected from a group consisting of a hydroxyl group-containing monomer, a carboxyl group-containing monomer, an amino group-containing monomer and a silicone-based vinyl monomer. In addition, the fluorine-containing polymer containing a curable functional group more preferably contains a polymeric unit based on a fluorine-containing monomer, and a polymeric unit based on at least one curable functional group-containing monomer selected from a group consisting of a hydroxyl group-containing monomer, and a carboxyl group-containing monomer.

As the fluorine-containing monomer, for example, tetrafluoroethylene, chlorotrifluoroethylene, vinylidene fluoride, vinyl fluoride and fluorovinyl ether may be mentioned, and one, or two or more of them may be used.

Among them, it is preferably at least one selected from the group consisting of tetrafluoroethylene, chlorotrifluoroethylene and vinylidene fluoride, and more preferably at least one selected from the group consisting of tetrafluoroethylene and chlorotrifluoroethylene.

With respect to the total polymeric units of the fluorine-containing polymer containing a curable functional group, the polymeric unit based on a fluorine-containing monomer is preferably from 15 mol %-50 mol %. The lower limit thereof is more preferably 20 mol %, further preferably 30 mol %, and particularly preferably 40 mol %. The upper limit thereof is more preferably 49 mol %, and further preferably 47 mol %.

With respect to the total polymeric units of the fluorine-containing polymer containing a curable functional group, the polymeric unit based on a curable functional group-containing monomer is preferably 8 mol %-30 mol %. The lower limit thereof is more preferably 10 mol %, and the upper limit thereof is more preferably 20 mol %.

As the curable functional group-containing monomer, for example, the following monomers can be exemplified, but it is not limited thereto. It should be noted that one, or two or more of them may be used.

(1-1) Hydroxyl Group-Containing Monomer:

As the hydroxyl group-containing monomer, for example, a hydroxyl group-containing vinyl ether, such as 2-hydroxyethyl vinyl ether, 3-hydroxypropyl vinyl ether, 2-hydroxypropyl vinyl ether, 2-hydroxy-2-methylpropyl vinyl ether, 4-hydroxybutyl vinyl ether, 4-hydroxy-2-methylbutyl vinyl ether, 5-hydroxypentyl vinyl ether, or 6-hydroxyhexyl vinyl ether, a hydroxyl group-containing allyl ether, such as 2-hydroxyethyl allyl ether, 4-hydroxybutyl allyl ether, or glycerol monoallyl ether, and the like may be mentioned. Among them, from a viewpoint of excellent polymerization reactivity and curability of the functional groups, the hydroxyl group-containing vinyl ether is preferable, and a hydroxyl group-containing monomer represented by the formula (1) is more preferable:

(In the formula, 1 is 0 or 1, m is an integer of 2 or more), and at least one monomer selected from a group consisting of 4-hydroxybutyl vinyl ether, 2-hydroxyethyl vinyl ether, 2-hydroxyethyl allyl ether and 4-hydroxybutyl allyl ether are further preferable.

As other hydroxyl group-containing monomer, for example, hydroxyalkyl (meth)acrylate such as 2-hydroxyethyl acrylate and 2-hydroxyethyl methacrylate may be mentioned.

(1-2) Carboxyl Group-Containing Monomer:

As the carboxyl group-containing monomer, for example, it is preferably at least one monomer selected from a group consisting of a carboxyl group-containing monomer represented by the formula (2):

(In the formula, $R^1$, $R^2$ and $R^3$ are the same or different, and are a hydrogen atom, an alkyl group, a carboxyl group, an acyloxy group or alkoxycarbonyl group; n is an integer of 0 or more), esters and anhydrides thereof, and a carboxyl group-containing vinyl ether monomer represented by the formula (3):

(In the formula, $R^4$ and $R^5$ are the same or different, and are each saturated or unsaturated straight-chain, branched or cyclic alkylene group, N is 0 or 1, and m is 0 or 1).

As a specific example of the carboxyl group-containing monomer, for example, acrylic acid, methacrylic acid, vinyl acetic acid, crotonic acid, pentenoic acid, hexenoic acid, heptenoic acid, octenoic acid, nonenoic acid, decenoic acid, undecenoic acid, dodecenoic acid, tridecenoic acid, tetradecenoic acid, pentadecenoic acid, hexadecenoic acid, heptadecenoic acid, octadecenoic acid, nonadecenoic acid, eicosenoic acid, 22-tricosenic acid, cinnamic acid, itaconic acid, itaconic acid monoester, maleic acid, maleic acid monoester, maleic anhydride, fumaric acid, fumaric acid monoester, vinyl phthalate, vinyl pyromellitate, 3-allyloxypropionic acid, 3-(2-allyloxyethoxycarbonyl) propionic acid, 3-(2-allyloxybutoxycarbonyl) propionic acid, 3-(2-vinyloxyethoxycarbonyl) propionic acid, 3-(2-vinyloxybutoxycarbonyl) propionic acid, or the like may be mentioned. Among them, at least one acid selected from the group consisting of acrylic acid, crotonic acid, undecenoic acid, itaconic acid, maleic acid, maleic acid monoester, fumaric acid, fumaric acid monoester, 3-allyloxypropionic acid and 3-(2-allyloxyethoxycarbonoyl) propionic acid is preferable, due to low homopolymerizability and difficulty to obtain a homopolymer.

(1-3) Amino Group-Containing Monomer:

As the amino group-containing monomer, for example, amino vinyl ethers represented by $CH_2\!=\!CH\!-\!O\!-\!(CH_2)_x\!-\!NH_2$ (x=0 to 10), allyl amines represented by $CH_2\!=\!CH\!-\!O\!-\!CO(CH_2)_x\!-\!NH_2$ (x=1 to 10); and amino methyl styrene, vinyl amine, acrylamide, vinyl acetamide, vinyl formamide or the like may be mentioned.

(1-4) Silyl Group-Containing Monomer:

As the silyl group-containing monomer, for example, a silicone-based vinyl monomer may be mentioned. As the silicone-based vinyl monomer, for example, (meth)acrylates, such as $CH_2\!=\!CHCO_2(CH_2)_3Si(OCH_3)_3$, $CH_2\!=\!CHCO_2(CH_2)_3Si(OC_2H_5)_3$, $CH_2\!=\!C(CH_3)CO_2(CH_2)_3Si(OCH_3)_3$, $CH_2\!=\!C(CH_3)CO_2(CH_2)_3Si(OC_2H_5)_3$, $CH_2\!=\!CHCO_2(CH_2)_3Si\ CH_3(OC_2H_5)_2$, $CH_2\!=\!C(CH_3)CO_2(CH_2)_3SiC_2H_5(OCH_3)_2$, $CH_2\!=\!C(CH_3)CO_2(CH_2)_3Si(CH_3)_2(OC_2H_5)$, $CH_2\!=\!C(CH_3)CO_2(CH_2)_3Si(CH_3)_2OH$, $CH_2\!=\!CH(CH_2)_3Si(OCOCH_3)_3$, $CH_2\!=\!C(CH_3)CO_2(CH_2)_3SiC_2H_5(OCOCH_3)_2$, $CH_2\!=\!C(CH_3)C\ O_2(CH_2)_3Si\ CH_3(N(CH_3)C\ OCH_3)_2$, $CH_2\!=\!CHCO_2(CH_2)_3Si\ CH_3\ [ON(CH_3)C_2H_5]_2$, $CH_2\!=\!C(CH_3)C\ O_2(CH_2)_3SiC_6H_5[ON(CH_3)C_2H_5]_2$; vinyl silanes, such as $CH_2\!=\!CHSi[ON\!=\!C(CH_3)(C_2H_5)]_3$, $CH_2\!=\!CHSi(OCH_3)_3$, $CH_2\!=\!CHSOC_2H_5)_3$, $CH_2\!=\!CHSiCH_3(OCH_3)_2$, $CH_2\!=\!CHSi(OCOCH_3)_3$, $CH_2\!=\!CHSi(CH_3)_2(OC_2H_5)$, $CH_2\!=\!CHSi(CH_3)_2Si\ CH_3\ (OCH_3)_2$, $CH_2\!=\!CHSiC_2H_5(OCOCH_3)_2$, $CH_2\!=\!CHSiCH_3[ON(CH_3)C_2H_5]_2$, vinyltrichlorosilane or partial hydrolyzates thereof; vinyl ethers, such as trimethoxysilylethyl vinyl ether, triethoxysilylethyl vinyl ether, trimethoxysilylbutyl vinyl ether, methyldimethoxysilylethyl vinyl ether, trimethoxysilylpropyl vinyl ether, or triethoxysilylpropyl vinyl ether, or the like may be exemplified.

The fluorine-containing polymer containing a curable functional group preferably contains a polymeric unit based on at least one fluorine-free vinyl monomer selected from the group consisting of a carboxylic acid vinyl ester, an alkyl vinyl ether and a non-fluorinated olefin.

The carboxylic acid vinyl ester has an effect of improving compatibility. As the carboxylic acid vinyl ester, vinyl acetate, vinyl propionate, vinyl butyrate, vinyl isobutyrate, vinyl pivalate, vinyl caprylate, vinyl versatate, vinyl laurate, vinyl stearate, vinyl cyclohexane carboxylate, vinyl benzoate, vinyl p-tert-butylbenzoate or the like may be mentioned.

As the alkyl vinyl ether, methyl vinyl ether, ethyl vinyl ether, butyl vinyl ether, cyclohexyl vinyl ether or the like may be mentioned.

As the non-fluorinated olefin, ethylene, propylene, n-butene, isobutene or the like may be mentioned.

The polymeric unit based on the fluorine-free vinyl monomer preferably consistitues all the polymeric units other than the polymeric unit based on a curable functional group-containing monomer and the polymeric unit based on a fluorine-containing monomer.

As the fluorine-containing polymer containing a curable functional group, for example, (1) a perfluoroolefin-based polymer with perfluoroolefin unit as a main component, (2) a CTFE-based polymer with chlorotrifluoroethylene (CTFE) unit as a main component, (3) a VdF-based polymer with vinylidene fluoride (VdF) unit as a main component, (4) a fluoroalkyl group-containing polymer with fluoroalkyl unit as a main component, (5) a vinyl acetate-based polymer with vinyl acetate unit as a main component, or the like may be mentioned.

As the fluorine-containing polymer containing a curable functional group, among the polymers (1)-(5) as mentioned above, the polymers (1), (2) and (5) are preferred from the viewpoint of weather resistance and moisture resistance.

(1) Perfluoroolefin-Based Polymer with Perfluoroolefin Unit as a Main Component

The perfluoroolefin-based polymer with perfluoroolefin unit as a main component preferably contains a perfluoroolefin unit. With respect to the total polymeric units in the perfluoroolefin-based polymer, the perfluoroolefin unit is preferably 20 mol % to 49 mol %. A more preferred lower limit is 30 mol %, and a further preferred lower limit is 40 mol %. A more preferred upper limit of 47 mol %.

As the perfluoroolefin, tetrafluoroethylene (TFE), hexafluoropropylene (HFP), perfluoro (alkyl vinyl ether) (PAVE) or the like may be mentioned. Among them, from the viewpoint of excellent pigment dispersibility, weather resistance, copolymerizability and chemical resistance, TFE is preferable.

The perfluoroolefin-based polymer preferably comprises a unit of other monomer capable of copolymerizing with the perfluoroolefin.

As the other monomer capable of copolymerizing, carboxylic acid vinyl esters, such as vinyl acetate, vinyl propionate, vinyl butyrate, vinyl isobutyrate, vinyl pivalate, vinyl caprylate, vinyl versatate, vinyl laurate, vinyl stearate, vinyl cyclohexane carboxylate, vinyl benzoate, or vinyl p-tert-butylbenzoate; alkyl vinyl ethers, such as methyl vinyl ether, ethyl vinyl ether, butyl vinyl ether, or cyclohexyl vinyl ether; non-fluorinated olefins, such as ethylene, propylene, n-butene, or isobutene; a fluorine-containing monomers, such as vinylidene fluoride (VdF), chlorotrifluoroethylene (CTFE), vinyl fluoride (VF), or fluorovinyl ether, or the like may be mentioned, but it is not limited thereto.

As the perfluoroolefin-based polymer with perfluoroolefin unit as a main component, for example, a copolymer of TFE/isobutene/hydroxybutyl vinyl ether/other monomer, a copolymer of TFE/vinyl versatate/hydroxybutyl vinyl ether/other monomer, a copolymer of TFE/vinyl versatate/hydroxyethyl vinyl ether/other monomer, a copolymer of TFE/VdF/hydroxybutyl vinyl ether/other monomer and the like may be mentioned, and at least one copolymer selected from a group consisting of the copolymer of TFE/isobutene/hydroxybutyl vinyl ether/other monomer and the copolymer of TFE/vinyl versatate/hydroxybutyl vinyl ether/other monomer is particularly preferable. As a coating of such a curable polymer, for example, Zeffle (registered trademark) GK series manufactured by Daikin Industries Co., Ltd. or the like may be exemplified.

(2) CTFE-Based Polymer with Chlorotrifluoroethylene (CTFE) Unit as a Main Component As the CTFE-based polymer with CTFE unit as a main component, for example, a copolymer of CTFE/hydroxybutyl vinyl ether/other monomer or the like may be mentioned. As a curable polymer coating of CTFE-based polymer, LUMIFLON (registered trademark) manufactured by Asahi Glass Co., Ltd., FLUONATE (registered trademark) as manufactured by Dainippon Ink Co., Ltd., Cefral Coat (registered trademark) manufactured by Central Glass Co., Ltd., Zaffron (registered trademark) manufactured by Toagosei Co., Ltd., or the like may be mentioned.

(3) VdF-Based Polymer with Vinylidene Fluoride (VdF) Unit as a Main Component

As the VdF-based polymer with VdF unit as a main component, for example, a copolymer of VdF/TFE/hydroxybutyl vinyl ether/other monomer, or the like may be mentioned.

(4) Fluoroalkyl Group-Containing Polymer with Fluoroalkyl Unit as a Main Component As the fluoroalkyl group-containing polymer with fluoroalkyl unit as a main component, for example, a copolymer of $CF_3CF_2(CF_2CF_2)_1CH_2CH_2OCOCH=CH_2$ (a mixture of n=3 and 4)/2-hydroxyethyl methacrylate/stearyl acrylate or the like may be mentioned. As the fluoroalkyl group-containing polymer, UNIDYNE (registered trademark) or FTONE (registered trademark) manufactured by Daikin Industries Co., Ltd., Zonyl (registered trademark) manufactured by DuPont or the like may be exemplified.

(5) Vinyl Acetate-Based Polymer with Vinyl Acetate Unit as a Main Component

As the vinyl acetate-based polymer with vinyl acetate unit as a main component, a compolymer of fluorine-containing monomer/vinyl acetate/hydroxyl group-containing monomer represented by the formula (1)/carboxyl group-containing monomer represented by the formula (2). Among the copolymers, the molar ratio of fluorine-containing monomer/vinyl acetate/hydroxyl group-containing monomer represented by the formula (1)/carboxyl group-containing monomer represented by the formula (2) is preferably 15-50/20-75/5-22/0.1-5, more preferably 15-50/23-75/5-22/0.1-5.

With regard to the ratio of the fluorine-containing monomer unit to the vinyl acetate unit in the copolymer, from the viewpoint of weather resistance, solvent resistance, stain resistance and coating film hardness, the ratio of the fluorine-containing monomer unit is further preferably 0.16-0.51, with respect to the total moles of the fluorine-containing monomer unit and the vinyl acetate unit. The ratio is preferably 0.22 or greater, and preferably 0.50 or less. The ratio can be calculated from the fluorine content (% by mass) determined by elemental analysis, and the composition analysis based on $^1$HNMR spectrum. The copolymer having the above-mentioned ratio is a novel copolymer discovered by the present invention.

As the hydroxyl group-containing monomer represented by the formula (1), it is preferably at least one monomer selected from the group consisting of hydroxyethyl vinyl ether (HEVE), hydroxybutyl vinyl ether (HBVE), 2-hydroxyethyl allyl ether and 4-hydroxybutyl allyl ether.

As the carboxyl group-containing monomer represented by the formula (2), the value of n is preferably large from the viewpoint of improving the polymerization reactivity, and improving the compatibility with an additive such as a curing agent. As n, it is preferably 2 or more, more preferably 4 or more, still more preferably 8 or more. The upper limit is for example 20. As the carboxyl group-containing monomer represented by the formula (2), it is preferably at least one monomer selected from the group consisting of pentenoic acid, hexenoic acid, heptenoic acid, octenoic acid, nonenoic acid, decenoic acid, undecenoic acid, dodecenoic acid, tridecenoic acid, tetradecenoic acid, pentadecenoic acid, hexadecenoic acid, heptadecenoic acid, octadecenoic acid, nonadecenoic acid, eicosenoic acid, and 22-tricosenic acid, and more preferably undecenoic acid.

The copolymer may also contain other monomer unit. With respect to the total structural units constituting the copolymer, the other monomer unit is preferably 0 mol % or more and 40 mol % or less, more preferably 25 mol % or less. As the other monomer, non-aromatic vinyl esters other than vinyl acetate, or the like may be mentioned. As the non-aromatic vinyl esters, vinyl versatate, vinyl laurate, vinyl stearate, vinyl cyclohexane carboxylate or the like may be mentioned.

The vinyl acetate-based polymer preferably has a number average molecular weight of 3000-100000. The number average molecular weight is more preferably 5000 or more, still more preferably 8000 or more, and more preferably 50000 or less, still more preferably 35000 or less. The number average molecular weight can be measured by a gel permeation chromatography (GPC) using tetrahydrofuran as an eluent.

The vinyl acetate-based polymer has a glass transition temperature (second run), determined using a differential scanning calorimeter (DSC), of preferably 10° C. to 70° C., and more preferably 15° C. to 60° C.

The vinyl acetate-based polymer preferably has an acid value of 0.6 mgKOH/g to 28.8 mgKOH/g, and more preferably 2 mgKOH/g to 12 mgKOH/g. The acid value is measured in accordance with JIS K 5601.

The vinyl acetate-based polymer preferably has a hydroxyl value of 29 mgKOH/g to 120 mgKOH/g, and more preferably 100 mgKOH/g or less. The hydroxyl value can be calculated from the actual feeding amount of hydroxy monomer for polymerization and the solid concentration.

The fluorine-containing polymer containing a curable functional group may be manufactured according to the method disclosed in for example Japanese Laid-Open Publication No. 2004-204205, or Japanese Laid-Open Publication No. 2013-177536.

In addition, the novel polymer where the ratio of the fluorine-containing monomer unit to the vinyl acetate unit is from 0.16 to 0.51 may be manufactured by a solution polymerization method, an emulsion polymerization method, a suspension polymerization method or a bulk polymerization method, and among them, it is preferably manufactured by the solution polymerization method.

In the solution polymerization, monomers, an organic solvent and a polymerization initiator can be used. The polymerization temperature is usually 0° C. to 150° C., preferably 5° C. to 95° C. The polymerization pressure is usually 0.1 MPaG to 10 MPaG (1 kgf/cm²G to 100 kgf/cm²G).

As the organic solvent, esters such as methyl acetate, ethyl acetate, propyl acetate, n-butyl acetate or tert-butyl acetate, ketones such as acetone, methyl ethyl ketone or cyclohexanone, aliphatic hydrocarbons such as hexane, cyclohexane, octane, nonane, decane, undecane, dodecane or mineral spirit; aromatic hydrocarbons such as benzene, toluene, xylene, naphthalene or solvent naphtha, alcohols such as methanol, ethanol, tert-butanol, isopropanol, or ethylene glycol monoalkyl ether, cyclic ethers such as tetrahydrofuran, tetrahydropyran or dioxane, dimethyl sulfoxide or the like, or mixtures thereof or the like may be mentioned.

As the polymerization initiator, for example, persulfates, such as ammonium persulfate or potassium persulfate (a reducing agent, such as sodium bisulfite, sodium pyrosulfite, cobalt naphthenate or dimethyl aniline, may also be used in combination if necessary), redox initiators formed by an oxidizing agent (such as ammonium peroxide, or potassium peroxide) with a reducing agent (such as sodium sulfite) and a transition metal salt (such as ferric sulfate), diacyl peroxides, such as acetyl peroxide or benzoyl peroxide, dialkoxycarbonyl peroxides, such as isopropoxycarbonyl peroxide or tert-butoxycarbonyl peroxide, ketone peroxides, such as methyl ethyl ketone peroxide or cyclohexanone peroxide, hydroperoxides such as hydrogen peroxide, tert-butyl hydroperoxide or cumene hydroperoxide, dialkyl peroxides such as di-t-butyl peroxide or dicumyl peroxide; alkyl peroxy esters, such as t-butyl peroxyacetate or t-butyl peroxypivalate, azo-based compounds, such as 2,2'-azobisisobutyronitrile, 2,2'-azobis(2,4-dimethylvaleronitrile), 2,2'-azobis(2-methylvaleronitrile), 2,2'-azobis(2-cyclopropylpropionitrile), dimethyl 2,2'-azodiisobutyrate, 2,2'-azobis[2-(hydroxymethyl)propionitrile] or 4,4'-azobis(4-cyano pentenoic acid), or the like may be used.

The composition of the present invention contains pentamethylene diisocyanate-based curing agent.

As the pentamethylene diisocyanate-based curing agent, it is preferably at least one selected from the group consisting of a blocked isocyanate compound based on the pentamethylene diisocyanate (PDI) and a polyisocyanate compound derived from the pentamethylene diisocyanate (PDI).

By using the blocked isocyanate compound based on the pentamethylene diisocyanate (PDI) (hereinafter also referred to simply as a blocked isocyanate) as the polyisocyanate compound, it is possible for the aqueous dispersion to have a sufficient pot life (usable time).

As the blocked isocyanate, it is preferably a material obtained by reacting a polyisocyanate compound derived from pentamethylene diisocyanate (hereinafter also referred to as the polyisocyanate compound (II)) with a blocking agent.

As the polyisocyanate compound (II), for example, an adduct obtained from pentamethylene diisocyanate with an aliphatic polyhydric alcohol having 3 or more hydroxyls through addition polymerization, an isocyanurate structure (nurate structure) formed from pentamethylene diisocyanate, and biuret formed from pentamethylene diisocyanate may be mentioned.

As the adduct, it is preferable to have a structure represented by the general formula (6):

[Chem. 1]

(6)

(In the formula, $R^4$ represents an aliphatic hydrocarbon group having 3-20 carbon atoms; k is an integer of 3-20).

$R^4$ in the general formula (6) is a hydrocarbon group based on the aliphatic polyhydric alcohol having 3 or more hydroxyls, more preferably an aliphatic hydrocarbon group having 3-10 carbon atoms, still more preferably an aliphatic hydrocarbon group having 3-6 carbon atoms.

k is the number corresponding to the number of hydroxyls of the above-mentioned aliphatic polyhydric alcohol. As k, it is more preferably an integer of 3-10, still more preferably an integer of 3-6.

The isocyanurate structure has 1, or 2 or more isocyanurate rings represented by the general formula (2) in the molecule.

[Chem. 2]

(2)

As the isocyanurate structure, a trimer obtained by trimerization reaction of the isocyanates, a pentomer obtained by pentamerization reaction of the isocyanates, or a heptamer obtained by heptamerization reaction of the isocyanates may be mentioned.

Among them, a trimer represented by the following general formula (7) is preferable.

[Chem. 3]

(7)

The biuret is a compound having a structure represented by the following general formula (8):

[Chem. 4]

(8)

The compound may be obtained by trimerization of pentamethylene diisocyanate under conditions different from the case of obtaining the isocyanurate structure.

As the blocking agent, a compound having an active hydrogen is preferably used. As the compound having an active hydrogen, it is preferable to use for example at least one selected from the group consisting of alcohols, oximes, lactams, active methylene compounds and pyrazole compounds.

Thus, the blocked isocyanate is a material obtained by reacting the polyisocyanate compound derived from pentamethylene diisocyanate with a blocking agent, and the blocking agent is preferably at least one selected from the group consisting of alcohols, oximes, lactams, active methylene compounds and pyrazole compounds.

In a case that the polyisocyanate compound (II) used to obtain the blocked isocyanate is an adduct of pentamethylene diisocyanate and the aliphatic polyhydric alcohol having 3 or more hydroxyls, as the aliphatic polyhydric alcohol having 3 or more hydroxyls, in particular, trihydric alcohols, such as glycerol, trimethylol propane (TMP), 1,2,6-hexane triol, trimethylol ethane, 2,4-dihydroxy-3-hydroxymethyl pentane, 1,1,1-tris(bis-hydroxymethyl) propane, or 2,2-bis (hydroxymethyl)butanol-3, tetrahydric alcohols, such as pentaerythritol or diglycerin, pentahydric alcohols (pentitol), such as arabitol, ribitol, or xylitol, hexahydric alcohols (hexitol), such as sorbitol, mannitol, galactitol or allodulcite, or the like may be mentioned. Among them, trimethylol propane, and pentaerythritol are particularly preferable.

The adduct is obtained through addition polymerization of pentamethylene diisocyanate and the aliphatic polyhydric alcohol having 3 or more hydroxyls.

As the compound having an active hydrogen to be reacted with the polyisocyanate compound (II), in particular, alcohols, such as methanol, ethanol, n-propanol, isopropanol, or methoxy propanol, oximes, such as acetoxime, 2-butanone oxime, or cyclohexanone oxime, lactams, such as ε-caprolactam, active methylene compounds, such as methyl acetoacetate or ethyl malonate, pyrazole compounds, such as 3-methyl pyrazole, 3,5-dimethyl pyrazole or 3,5-diethyl pyrazole may be mentioned, and one, or two or more of them may be used.

Among them, the active methylene compounds and oximes are preferable, and the active methylene compounds are more preferable.

As the polyisocyanate compound, a polyisocyanate compound derived from pentamethylene diisocyanate (PDI) (hereinafter also referred to as the polyisocyanate compound (III)) can also be used. As the polyisocyanate compound (III), the above-mentioned material as the polyisocyanate compound (II) may be mentioned.

As a specific example of the polyisocyanate compound (III), D370N, D376N, and D3725N manufactured by Mitsui Chemicals Co., Ltd., or the like may be mentioned.

It should be noted that the composition of the present invention may further contain other ingredients, as long as the fluorine-containing polymer containing a curable functional group and the pentamethylene diisocyanate-based curing agent are comprised. One, or two or more of the other ingredients may be used.

In the compositions of the present invention, with respect to 100% by mass of the total amount of the nonvolatile components in the composition, the content of the fluorine-containing polymer containing a curable functional group is preferably 20% by mass to 95% by mass.

With respect to 1 equivalent of the curable functional group in the fluorine-containing polymer containing a curable functional group, the content of the pentamethylene diisocyanate-based curing agent is 0.1 equivalent to 5 equivalents, preferably 0.5 equivalent to 1.5 equivalents.

In more detail, the ratio of the pentamethylene diisocyanate-based curing agent to the fluorine-containing polymer containing a curable functional group is such that the number of functional groups in the pentamethylene diisocyanate-based curing agent is 0.1 to 5 equivalents, preferably 0.5 to 1.5 equivalents, and more preferably 0.7 to 1.2 equivalents, with respect to the number of functional groups in the fluorine-containing polymer containing a curable functional group.

The content of the curable functional group in the fluorine-containing polymer containing a curable functional group may be calculated by appropriately combining NMR, FT-IR, elemental analysis, fluorescent X-ray analysis, and neutralization titration according to the type of monomer.

It should be noted that in this specification, the contents of the fluorine-containing polymer containing a curable functional group and the pentamethylene diisocyanate-based curing agent are each based on the mass of the non-volatile components after the solvent or the like is removed.

Due to comprising the fluorine-containing polymer containing a curable functional group and the pentamethylene diisocyanate-based curing agent, the composition of the present invention can form a coating film having a good adhesion to a substrate even after a pressure cooker test. In addition, the coating film also has a good adhesion with the sealant layer such as EVA.

From the viewpoint of a good adhesion with the substrate, the composition of the present invention preferably further contains a polyol compound.

The polyol compound preferably has a hydroxyl value of 10-300. When the hydroxyl value is within the above range, the resultant coating film is strongly adhered to the water-impermeable sheet and the sealant layer formed from EVA.

The polyol compound preferably has a number average molecular weight of 300-4000. The number average molecular weight is measured by gel permeation chromatography.

From the viewpoint of a good adhesion with the substrate or the sealant layer such as EVA, the polyol compound is preferably at least one selected from the group consisting of a polyol containing cyclohexane, a polyester polyol, a polycarbonate polyol, a polyether polyol and a polybutadiene polyol. It is more preferably at least one selected from the group consisting of a polyol containing cyclohexane, a polyester polyol, a polyether polyol and a polybutadiene polyol.

In the above-mentioned composition, the polyol compound is in an amount of 0.1% by mass or more and less than 100% by mass, with respect to the fluorine-containing polymer. The polyol compound is preferably in an amount of 1% by mass or more, more preferably 5% by mass or more, particularly preferably 20% by mass or more, and preferably 50% by mass or less, and more preferably 40% by mass or less, with respect to the fluorine-containing polymer. When the content of the polyol compound is too large, then the weather resistance of the coating film may be deteriorated; when the content is too small, then the adhesion of the coating film with the water-impermeable sheet and the sealant layer formed from EVA may be deteriorated.

As the polyol compound, a commercially available product may also be used. As the commercially available product, for example, Flexorez 148, Flexorez 188, and Flexorez A308 manufactured by Kusumoto Chemicals, Ltd., ETERNACOLL UH-50 and ETERNACOLL UM-90 manufactured by Ube Industries Co., Ltd., ADEKA Polyether P-400 and ADEKA Polyol BPX-21 manufactured by ADEKA Co., Ltd., NISSO-PB GI-1000, GI-2000 and GI-3000 manufactured by Nippon Soda Co., Ltd., Sovermol 908 manufactured by BASF, CMA3190 manufactured by Jiangsu Huada company, Priplast 3190 manufactured by Croda company, PH50 manufactured by Ube Industries Co., Ltd. or the like may be mentioned.

From the viewpoint of a good adhesion with the substrate or the sealant layer such as EVA, the composition of the present invention preferably further contains a melamine resin.

As the melamine resin, a compound etherified by reacting a methylol melamine derivative obtained from a condensation of melamine and formaldehyde, with methanol, ethanol, isopropanol, butanol, isobutanol or the like, which are lower alcohols, and mixtures thereof may be preferably metioned.

As the methylol melamine derivative, for example, monomethylol melamine, dimethylol melamine, trimethylol melamine, tetramethylol melamine, pentamethylol melamine, hexamethylol melamine or the like may be mentioned.

As the type of the melamine resin, it can be divided into a completely alkylated type, a methylol type, an imino type, and a methylol/imino type, according to the ratio of alkoxylaton, all of which may be used in the present invention.

As the melamine resin, a benzene ring-containing melamine resin is more preferable. As a commercially available product of the melamine resin, M-85 and M-25 manufactured by Melcross, or the like may be mentioned.

In the compositions of the present invention, the melamine resin is preferably in an amount of 0.1% by mass to 10% by mass, more preferably 0.1% by mass to 5% by mass, still more preferably 0.1% by mass to 3% by mass, with respect to the fluorine-containing polymer. When the content of the melamine resin is too large, then the weather resistance may be deteriorated; when the content is too small, then the adhesion of the coating film may be deteriorated.

A variety of additives may be further compounded in the composition of the present invention according to the required characteristics. As the additive, a curing accelerator, a pigment, a pigment dispersant, an antifoaming agent, a leveling agent, a UV absorbent, a light stabilizer, a thickener, an adhesion improver, a matting agent or the like may be mentioned.

As the curing accelerator, for example, an organic tin compound, an acidic phosphoric ester, a reaction product of an acidic phosphoric acid ester and an amine, a saturated or unsaturated polyvalent carboxylic acid or its anhydride, an organic titanate compound, an amine-based compound, lead octoate or the like may be mentioned.

As the curing accelerator, typical acid catalysts may be used. For example, acid catalysts blocked with amine such as dimethyl oxazolidine or 2-amino-2-methyl-1-propanol, non-blocked dodecylbenzenesulfonic acid, p-toluenesulfonic acid, dinonylnaphthalenesulfonic acid or the like may be mentioned.

As the acid catalyst, it is preferably at least one selected from the group consisting of dodecylbenzenesulfonic acid, dodecylbenzenesulfonic acid blocked with amine, p-toluenesulfonic acid, acidic phenyl phosphate, dinonylnaphthalenesulfonic acid blocked with amine and acidic phenyl phosphate.

In the compositions of the present invention, the curing accelerator is preferably in an amount of 0.01% by mass to 10% by mass, more preferably 0.01% by mass to 5% by mass, further more preferably 0.1% by mass to 3% by mass, with respect to the fluorine-containing polymer. When the content of the curing accelerator is too large, then the usable time may be deteriorated; when the content is too small, then the adhesion of the coating film with the water-impermeable sheet may be deteriorated.

One type of the curing accelerator may be used, or two or more types may be used in combination.

The composition of the present invention preferably further comprises a pigment. Thus, the resultant cured coating film is excellent in UV shielding property. In addition, from the viewpoint of the esthetic appearance of the solar cell module, it is strongly desirable to add a pigment.

As the pigment, in particular, inorganic pigments, such as titanium dioxide and calcium carbonate as a white pigment, carbon black as a black pigment, and composite metals such as Cu—Cr—Mn alloy, organic pigments, such as phthalocyanine, quinacridone or azo type may be mentioned, but it is not limited thereto.

With respect to 100 parts by mass of the fluorine-containing polymer containing a curable functional group, the pigment is preferably added in an amount of 0.1 part by mass to 200 parts by mass, more preferably 0.1 part by mass to 160 parts by mass.

The composition of the present invention preferably further comprises an ultraviolet absorbent. Since the solar cell may be used for a long-term in the outdoors with strong ultraviolet ray, there is a demand for a countermeasure against the deterioration of the back sheet due to ultraviolet rays. When an ultraviolet absorbent is added in the composition of the present invention, it is possible to impart the cured coating film layer with ultraviolet absorbing function.

As the ultraviolet absorbent, any ultraviolet absorbent of organic or inorganic type may be used. In the organic compound, for example, ultraviolet absorbents, such as salicylate type, benzotriazole type, benzophenone type, or cyanoacrylate type, may be mentioned; in the inorganic compound, filler type inorganic ultraviolet absorbents, such as zinc oxide or cerium oxide, are preferable.

One type of the ultraviolet absorbent may be used, or two or more types may be used in combination. The ultraviolet absorbent is preferably in an amount of 0.1% by mass to 15% by mass, with respect to 100% by mass of the total amount of the fluorine-containing polymer containing a curable functional group in the coating. In the case where the amount of the ultraviolet absorbent is too small, the effect of improving the light resistance cannot be sufficiently obtained; and even if it is too much, the effect is saturated.

It is one preferable embodiment that the composition of the present invention is a coating.

The composition of the present invention can be prepared in the form of a solvent-type coating, a water-based coating, a powder coating or the like by a conventional method. From the viewpoint of the ease of forming a film, curability, good drying property or the like, it is preferably in the form of a solvent-type coating.

As the solvent in the solvent-type coating, it is preferably an organic solvent, and esters such as ethyl acetate, butyl acetate, isopropyl acetate, isobutyl acetate, cellosolve acetate, or propylene glycol methyl ether acetate, ketones such as acetone, methyl ethyl ketone, methyl isobutyl ketone, or cyclohexanone, cyclic ethers such as tetrahydrofuran or dioxane, amides such as N,N-dimethylformamide or N,N-dimethylacetamide, aromatic hydrocarbons such as xylene, toluene, or solvent naphtha, glycol ethers such as propylene glycol methyl ether, or ethyl cellosolve, diethylene glycol esters such as carbitol acetate, aliphatic hydrocarbons such as n-pentane, n-hexane, n-heptane, n-octane, n-nonane, n-decane, n-undecane, n-dodecane, or mineral spirit, a mixed solvent thereof or the like may be mentioned.

Among them, esters are more preferable, and butyl acetate is further preferable.

In the case that the composition of the present invention is prepared as a solvent-type coating, the fluorine-containing polymer containing a curable functional group preferably has a concentration of 5% by mass to 95% by mass, more preferably 10% by mass to 70% by mass, with respect to 100% by mass of the total amount of the coating.

The present invention also relates to a coating film obtained from the above-mentioned composition. The coating film can be formed by applying the composition of the present invention onto a suitable substrate and curing it according to the use. The formation of the cured coating film on the substrate may be carried out by applying the composition of the present invention onto the sbustrate according to the form of the coating.

The application can be performed in a temperature range of normal conditions for the coating form. As for the curing and drying, it is performed at 10° C. to 300° C., typically at 100° C. to 200° C. for 30 seconds to 3 days. Thus, in the case that the composition of the present invention is used to coat the back sheet of the solar cell module, as a water-impermeable sheet, even a material which should avoid a high temperature treatment, such as Si vapor-deposited PET sheet, may be used without problems. After curing and drying, a maintenance may be performed, typically at 20° C. to 300° C. for 1 minute to 3 days.

The application on the substrate can be performed by directly applying the composition of the present invention on the substrate.

From the viewpoint of good shielding property, weather resistance, chemical resistance, and moisture resistance, the cured coating film preferably has a thickness of 1 μm or more, more preferably 3 μm or more, and still more preferably 5 μm or more. For the reason that the lightweighted effect cannot be obtained if it is too thick, the upper limit is preferably about 100 μm, more preferably about 100 μm. As the film thickness, it is particularly preferably 3 μm to 40 μm.

The coating film obtained from the composition of the present invention has a good adhesion to the substrate even after a pressure cooker test, and has an excellent adhesion to general EVA as a sealant for a solar cell module. Besides, it also has an excellent blocking resistance when being wound, so it can be particularly suitable for application on the back sheet of the solar cell module, which is generally manufactured through a winding process.

In the case of coating the back sheet of the solar cell module, the above-mentioned coating film is formed on one side or both sides of a substrate such as a water-impermeable sheet.

In the case where the coating film obtained from the composition of the present invention is formed on one side of the substrate and the other side of the substrate is an uncoated side, the coating film is in contact with the uncoated side of the substrate in the winding process. In addition, in the case where the coating film is formed on one side of the substrate, and a coating film obtained from other coatings (a curied coating film of a fluorine-containing polymer coating without a curable functional group, a coating film of a polyester coating, primer coating or the like described later) or other sheet is provided on the other side of the substrate, the coating film obtained from the composition of the present invention is in contact with the coating film obtained from other coatings or the other sheet on the substrate in the winding process. In addition, in the case where the coating film obtained from the composition of the present invention is formed on both sides of the substrate, the coating film is in contact with the same kind of coating film formed on the other side of the substrate in the winding process.

For the coating films obtained from the composition of the present invention, they can exert excellent blocking resistance with respect to the contact side in any case.

The present invention also relates to a back sheet of the solar cell module, which has a water-impermeable sheet and a coating film formed on at least one side of the water-impermeable sheet, and the coating film is obtained from the above-mentioned composition.

The water-impermeable sheet is a layer configured to prevent moisture from permeating to the sealant or the solar cell, and it can be used as long as it is a material that is substantially impermeable for water. For example, polycarbonate resin, acrylic resin, methacrylic resin, acrylonitrile-butadiene-styrene copolymer (ABS resin), polystyrene, polyolefin resin (polyethylene, polypropylene, etc.), polyvinyl halide resin (polyvinyl chloride, polyvinylidene chloride, polyvinyl fluoride, polyvinylidene fluoride, etc.), polyester resin (polyethylene terephthalate, polybutylene terephthalate, or the like), polyamide resin (nylon 6, nylon 66, MXD nylon (m-xylylenediamine-adipic acid copolymer), etc.), substituted olefinic polymers (polyvinyl acetate, polyvinyl alcohol, etc.), EVA (ethylene-vinyl alcohol copolymer), ethylene-tetrafluoroethylene copolymer, polyurethane resin (thermoplastic polyurethane, etc.) or the like may be mentioned, and two or more of these materials can be used in combination. From the perspective of weight, price, flexibility, etc., PET sheets, Si vapor-deposited PET sheets, metal thin sheets such as aluminum or stainless steel, and the like are mostly used. Among them, PET sheets are often used. The thickness is usually about 50 µm to 250 µm. Si vapor-deposited PET sheet is often used when the moisture resistance is particularly necessary. The thickness is usually about 10 µm to 20 µm.

In addition, in order to improve the adhesion to the coating film, the water-impermeable sheet may be subjected to a conventionally known surface treatment. As the surface treatment, corona discharge treatment, plasma discharge treatment, chemical treatment, sand blasting in the case of a metal sheet, or the like may be mentioned.

The method for forming the coating film on the water-impermeable sheet is described as above.

The coating film may be formed only on a single side of the water-impermeable sheet, or may be formed on both sides.

Due to the excellent adhesion of the back sheet as described above with the sealant, in a solar cell module having such a back sheet, it is less likely to generate voids at the interface between the back sheet and the sealant, and it is possible to more reliably protect the solar cell.

The present invention also relates to a solar cell module, which has a water-impermeable sheet, a coating film formed on at least one side of the water-impermeable sheet, and a sealant layer formed above the coating film, wherein the coating film is obtained from the above-mentioned composition.

Figure 1:
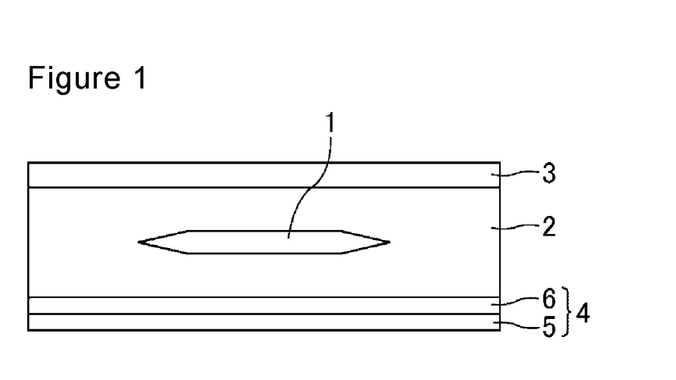
FIG. 1 is a schematic sectional view of the first structure of the solar cell module.
Figure 2:
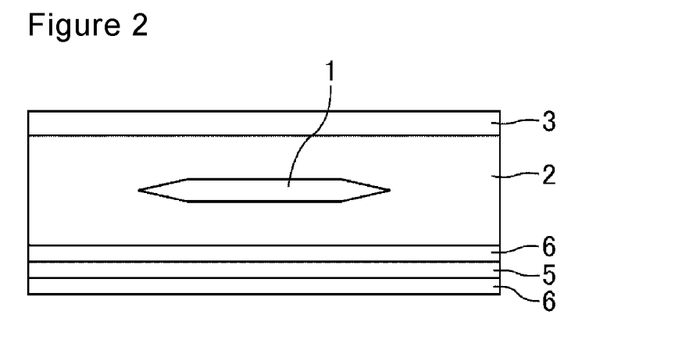
FIG. 2 is a schematic sectional view of the second structure of the solar cell module.
Figure 3:
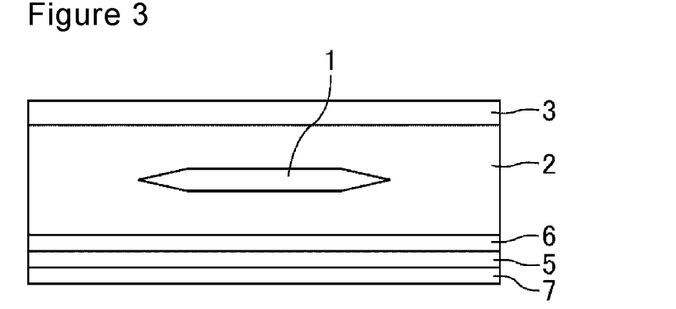
FIG. 3 is a schematic sectional view of the third structure of the solar cell module.

As a preferred structure for the solar cell module, for example, the structure illustrated in FIGS. 1 to 3 may be mentioned.

In the first structure as shown in FIG. 1, the solar cell 1 is sealed by the sealant layer 2, and the sealant layer 2 is interposed between a surface layer 3 and a back sheet 4. The back sheet 4 is further comprised of a water-impermeable sheet 5 and a cured coating film 6, and the cured coating film 6 is obtained from the composition of the present invention. In this first structure, the cured coating film 6 is provided only on the side of the sealant layer 2.

The sealant layer 2 is composed of ethylene/vinyl acetate copolymer (EVA), polyvinyl butyral (PVB), silicone resin, epoxy resin, acrylic resin or the like.

A glass plate is generally used in the surface layer 3, but a flexible material such as a resin sheet may also be used.

The second structure as shown in FIG. 2 is a three-layer structure obtained by forming a cured coating film 6 on both sides of the water-impermeable sheet 5.

In this second structure, although the film thickness of the back sheet is increased, it has two advantages of both the adhesion caused by the cured coating film 6 on the side of the sealant layer 2 and the weather resistance caused by the cured coating film 6 on the side opposite to the sealant layer.

As a back sheet having a three-layer structure, it may also be a back sheet having a three-layer structure formed by forming a cured coating film obtained from the composition of the present invention on one side of the water-impermeable sheet, and forming a cured coating film of a fluorine-containing polymer without a curable functional group, a fluorine-containing polymer sheet, a polyester sheet or a coating film of a polyester coating (other sheet or coating film) on the other side of the water-impermeable sheet.

The third structure shown in FIG. 3 is a structure, in which a cured coating film 6 obtained from the composition of the present invention is formed on the side of the sealant layer 2 of the water-impermeable sheet 5, and the other coating film 7 is formed on the side opposite to the sealant layer 2.

The material constituting the coating film 7 may be a cured coating film of a fluorine-containing polymer coating without a curable functional group, a fluorine-containing polymer sheet, a polyester sheet, or a coating film of a polyester coating.

In addition, in order to further improve the adhesion of the coating film with the sealant layer, the coating film may be subjected to a conventionally known surface treatment. As the surface treatment, for example, corona discharge treatment, plasma discharge treatment, chemical treatment, sand-blasting treatment or the like may be mentioned.

As the cured coating film of the fluorine-containing polymer coating wihout a curable functional group, for example, a cured coating film of a coating formed by mixing tetraalkoxysilane or its partial hydrolysate in PVdF as described in Japanese Patent Laid-Open No. 2004-214342; a cured coating film of a mixed coating of VdF/TFE/CTFE copolymer and acrylic resin containing alkoxysilane unit; a cured coating film of a mixed coating of VdF/TFE/HFP copolymer and acrylic resin containing hydroxyl; a cured coating film of a coating formed by mixing an aminosilane coupling agent in VdF/HFP copolymer, or the like may be mentioned. In view of good shielding property, weather resistance, chemical resistance, and moisture resistance, the film thickness is generally preferably 5 µm to 300 µm, more preferably 10 µm to 100 µm, and still more preferably 10 µm to 50 µm. In this case, a primer layer or the like may also be inserted.

It should be noted that the formation of the primer layer is performed by a conventional method using the conventionally well-known primer coating. As the coating for the primer layer, for example, epoxy resins, urethane resins, acrylic resins, silicone resins, polyester resins, or the like may be mentioned as representative examples.

As the fluorine-containing polymer sheet, fluorine-containing polymer sheets used for current back sheets, such as PVdF sheets or PVF sheets, PCTFE sheets, TFE/HFP/ethylene copolymer sheets, TFE/HFP copolymer (FEP) sheets, and TFE/PAVE copolymers (PFA) sheets, ethylene/TFE copolymer (ETFE) sheets, ethylene/CTFE copolymer (ECTFE) sheets or the like may be mentioned. From the viewpoint of good weather resistance, the film thickness is usually preferably 5 µm to 300 µm, more preferably 10 µm to 100 µm, and still more preferably 10 µm to 50 µm.

As the polyester sheet, a sheet used in a current back sheet can be used as it is, and its adhesion to the water-impermeable sheet 5 can be done by using acrylic adhesive, urethane adhesive, epoxy adhesive, polyester adhesive, or the like.

From the viewpoint of good weather resistance, cost, and transparency, the film thickness is generally preferably 5 μm to 300 μm, more preferably 10 μm to 100 μm, and still more preferably 10 μm to 50 μm.

As the polyester coating, a coating using a saturated polyester resin formed from polyvalent carboxylic acids, polyhydric alcohols and the like, and a coating using an unsaturated polyester resin formed from maleic anhydride, fumaric acid or the like and glycols may be mentioned, and the coating film may be formed by coating methods such as roll coating, curtain coating, spray coating, and die coating. In view of good shielding property, weather resistance, chemical resistance, and moisture resistance, the film thickness is preferably 5 μm to 300 μm, more preferably 10 μm to 100 μm, and still more preferably 10 μm to 50 μm. In this case, a primer layer or the like may also be inserted.

It should be noted that in addition to the above-mentioned application in the solar cell module, the composition of the present invention can also be directly coated onto metals, concretes, plastics or the like as an indoor coating for a building material, or an interior decorating material or the like, or as an outdoor coating for a building material, an exterior decorating material, automobiles, aircraft, ships, trams or the like, or over-coated on a underlying coating such as wash primer, anti-rust coating, epoxy coating, acrylic resin coating, polyester resin coating or the like. In particular, it can be suitably used as a coating film layer adhering to EVA layer, or various films or sheet materials manufactured through winding processes.

The present invention also relates to a laminate, characterized in comprising a substrate and a layer obtained from the above-mentioned composition. The layer obtained from the above-mentioned composition may be formed by coating the above-mentioned composition on a substrate, or may be formed by forming the above-mentioned composition into a film, and then laminating the film on the substrate, or may be a cured film formed by curing the above-mentioned composition. The layer obtained from the above-mentioned composition may be formed on only one side of the substrate, or may be formed on both sides of the substrate. The shape, thickness and the like of the substrate may be appropriately adjusted according to the use of the laminate. The substrate is preferably composed of metal, concrete or plastic.

The substrate and the layer obtained from the composition may be directly bonded, or may be bonded via other layer such as primer layer. Since the layer obtained from the composition is excellent in adhesion to the substrate, it may be directly bonded. When the substrate is directly bonded to the layer obtained from the composition, a lightweighted laminate can be achieved.

From the viewpoints of good shielding property, weather resistance, chemical resistance, and moisture resistance, the thickness of the layer obtained from the above-mentioned composition is preferably 1 μm or more, more preferably 3 μm or more, and still more preferably 5 μm or more. For the reason that the lightweighted effect cannot be obtained if it is too thick, the upper limit is preferably about 100 μm, and more preferably about 100 μm. As the thickness of the layer obtained from the above-mentioned composition, it is particularly preferably 3 to 40 μm.

As the plastic material of the substrate made of plastic, polycarbonate resin, acrylic resin, methacrylic resin, acrylonitrile-butadiene-styrene copolymer (ABS resin), polystyrene, polyolefin resin (polyethylene, polypropylene, etc.), polyvinyl halide resin (polyvinyl chloride, polyvinylidene chloride, polyvinyl fluoride, polyvinylidene fluoride, etc.), polyester resin (polyethylene terephthalate, polybutylene terephthalate, etc.), polyamide resin (nylon 6, nylon 66, MXD nylon (m-xylylenediamine-adipic acid copolymer), etc.), substituted olefin polymer (polyvinyl acetate, polyvinyl alcohol, etc.), EVA (ethylene-vinyl alcohol copolymer), ethylene-tetrafluoroethylene copolymer, polyurethane resin (thermoplastic polyurethane, etc.) and the like may be mentioned. Among them, polycarbonate resin, acrylic resin, polyvinyl chloride, polyethylene terephthalate, and polyurethane resin are preferable. Two or more of these materials may be used in combination.

In addition, in order to improve the adhesion to the layer obtained from the above-mentioned composition, the substrate may be subjected to a conventionally known surface treatment. As the surface treatment, for example, corona discharge treatment, plasma discharge treatment, chemical treatment, sand blasting in the case of a metal sheet, or the like may be mentioned.

The above-mentioned laminate can be used for building materials, interior decorating materials, exterior decorating materials, automobiles, aircraft, ships (board, deck, bilge, etc.), trams, tanks, bridges and the like. It is especially useful as interior and exterior decorating components for a vehicle.

Effect of Invention

Since the composition of the present invention has a constitution as described above, it is possible to form a coating film having a good adhesion to the substrate even after the pressure cooker test. Such a coating film is very useful as a coating film of back sheet of a solar cell module.

DETAILED DESCRIPTION

The present invention will be described in more detail by the examples, but the present invention is not limited by the examples.

The components described in the table are as follows.

Fluorine resin: a curable TFE based-copolymer solution, trade name: Zeffle GK570, manufactured by Daikin Industries, Ltd.

Diol: a diol containing cyclohexane, trade name: Sovermol 908 (a compound having the following structure), manufactured by BASF

[Chem. 5]

Diol: a polyester diol, CMA-3190, manufactured by Jiangsu Huada Corporation

Matting agent: CP4-8991, manufactured by Grace Corporation

Benzene ring-containing melamine resin: M-85, manufactured by Melcross

Curing accelerator (acid catalyst): CYCAT 600, 70% by mass solution of dodecylbenzenesulfonic acid in isopropanol, available from Cytec, Inc.)

PDI-based curing agent: D3725N, manufactured by Mitsui Chemicals Co., Ltd.

XDI-based curing agent: Takenate D120N, manufactured by Mitsui Chemicals Co., Ltd.

HDI-based curing agent: Sumidur N3300, manufactured by Sumika Bayer Urethane Co., Ltd.

Preparation Example 1

202 parts by mass of a curable TFE-based copolymer solution (Zeffle GK570 manufactured by Daikin Industries Co., Ltd., solid content: 65% by mass, hydroxyl value: 60 mgKOH/g, solvent: butyl acetate), 263.0 parts by mass of titanium dioxide (R960 manufactured by DuPont) as a white pigment and 167.0 parts by mass of butyl acetate were pre-mixed under stirring, and then 632 parts by mass of glass beads with a diameter of 1.2 mm were charged and a pigment disperser was used to disperse at 1500 rpm for 1 hour. After that, the glass beads were filtered out through a #80 mesh sieve, and 283.0 parts by mass of the curable TFE-based copolymer solution (Zeffle GK570) and 85.0 parts by mass of butyl acetate were added to the solution to prepare a white coating.

Into 1000 parts by mass of the white coating, 118.3 parts by mass of a diol (Sovermol 908, manufactured by BASF), 47.3 parts by mass of a matting agent (CP4-8991, manufactured by Grace Corporation), 4.7 parts by mass of benzene ring-containing melamine resin (M-85, Manufactured by Melcross), 4.7 parts by mass of an acid catalyst (CYCAT600, 70% by mass solution of dodecylbenzenesulfonic acid in isopropanol available from Cytec, Inc.), and 66.2 parts by mass (corresponding to 1 equivalent, with respect to 1.0 equivalent of the curable functional group in the curable TFE-based copolymer) of a curing agent (D3725N, manufactured by Mitsui Chemicals Co., Ltd., NCO content: 22.8%) were mixed to prepare coating 1.

Example 1

As a water-impermeable sheet, a PET film (DS10 manufactured by Tozai, thickness: 250 μm, sheet A) was used.

One side of the sheet A was subjected to corona treatment at 2000 W, and was applied with the coating 1 prepared in Preparation Example 1 using a coater such that the thickness of the dry film was 10 μm, and dried at 150° C. for 2 minutes to produce a back sheet A1 having a two-layer structure.

Next, the coating film surface of the back sheet A1 was subjected to corona treatment at 2000 W and maintained at 50° C. for 48 hours. Then an EVA resin sheet (F806P manufactured by First, thickness: 500 μm) was loaded on the coating film surface. A strengthened glass (manufactured by Wuxi Haida, 3.2 mm thick) was loaded on the EVA resin sheet, and pressed at 142° C. to produce a sample A1 having a three-layer structure (the embodiment shown in FIG. 1). For this glass/EVA/back sheet bonded sample A1, the adhesion (between EVA and back sheet) was investiageted and the results were listed in Table 1.

Test method and measurement method are as follows.

(Peel Strength)

The glass/EVA/back sheet bonded sample A1 obtained in Example 1 was measured for the adhesion between layers of EVA/back sheet by a peel test in the initial state and after 48 hours of PCT (pressure cooker test, 121° C., humidity: 100% RH, 2 atm). The EVA/back sheet portion of the measured sample was cut to a width of 1 cm×15 cm, and a 180-degree peel test was performed using Tensilon (manufactured by ORIENTEC). The adhesion strength between the EVA/back sheet was measured in N/cm.

(Breaking of Coating Film)

In the same manner as the peel strength, the coating film in the initial state and after 48 hours of PCT was visually evaluated.

(Coating Film/PET Peeling)

In the same manner as the peel strength, the coating film in the initial state and after 48 hours of PCT was visually evaluated.

(Film Thickness)

It was measured using a micrometer (manufactured by Mitutoyo Corporation) in accordance with JIS C-2151.

Example 2, and Comparative Examples 1 to 12

The coatings were prepared in the same manner as in Preparation Example 1, and back sheets of a two-layer structure and glass/EVA/back sheet bonded samples were prepared in the same manner as in Example 1, except that the components of the coating were changed as described in Table 1 or Table 2.

The results are shown in Table 1 or Table 2.

TABLE 1

| Structure name | Type | Example 1 | Example 2 | Comparative Example 1 | Comparative Example 2 | Comparative Example 3 | Comparative Example 4 | Comparative Example 5 |
|---|---|---|---|---|---|---|---|---|
| Fluorine resin (curable TFE based-copolymer solution) | GK570 | 485.0 | 485.0 | 603.3 | 603.3 | 603.3 | 603.3 | 603.3 |
| Titanium dioxide | R960 | 263.0 | 263.0 | 327.2 | 327.2 | 327.2 | 327.2 | 327.2 |
| Butyl acetate | | 252.0 | 252.0 | 313.4 | 313.4 | 313.4 | 313.4 | 313.4 |
| Diol | Sovermol 908 | 118.3 | | | | | | |
| Diol | CMA 3190 | | 118.3 | | | | | |
| Matting agent | CP4-8991 | 47.3 | 47.3 | 47.3 | 47.3 | 47.3 | 47.3 | 47.3 |
| Benzene ring-containing melamine resin | M-85 | 4.7 | 4.7 | | | | 4.7 | 4.7 | 4.7 |
| Acid catalyst | CYCAT600 | 4.7 | 4.7 | | | | | 4.7 |
| PDI-based curing agent | D3725N | 66.2 | 66.2 | | | | | |
| XDI-based curing agent | D120N | | | 121.8 | | 121.8 | | 121.8 |
| HDI-based curing agent | N3300 | | | | 64.3 | | 64.3 | |

TABLE 1-continued

| Structure name | Type | Example 1 | Example 2 | Comparative Example 1 | Comparative Example 2 | Comparative Example 3 | Comparative Example 4 | Comparative Example 5 |
|---|---|---|---|---|---|---|---|---|
| Adhesion (initial state) | Peel strength | 65-75 | 50-60 | 5 or less | 5 or less | 5 or less | 5 or less | 5 or less |
|  | Breaking of coating film | No | No | Yes | Yes | Yes | Yes | Yes |
|  | Coating film/PET peeling | No | No | Yes | Yes | Yes | Yes | Yes |
| Adhesion (after 48 hours of PCT) | Peel strength | 50-60 | 45-50 | 5 or less | 5 or less | 5 or less | 5 or less | 5 or less |
|  | Breaking of coating film | No | No | Yes | Yes | Yes | Yes | Yes |
|  | Coating film/PET peeling | No | No | Yes | Yes | Yes | Yes | Yes |

TABLE 2

| Structure name | Type | Comparative Example 6 | Comparative Example 7 | Comparative Example 8 | Comparative Example 9 | Comparative Example 10 | Comparative Example 11 | Comparative Example 12 |
|---|---|---|---|---|---|---|---|---|
| Fluorine resin (curable TFE based-copolymer solution) | GK570 | 603.3 | 485.0 | 485.0 | 485.0 | 485.0 | 485.0 | 485.0 |
| Titanium dioxide | R960 | 327.2 | 263.0 | 263.0 | 263.0 | 263.0 | 263.0 | 263.0 |
| Butyl acetate |  | 313.4 | 252.0 | 252.0 | 252.0 | 252.0 | 252.0 | 252.0 |
| Diol | Sovermol 908 |  | 118.3 | 118.3 | 118.3 | 118.3 | 118.3 | 118.3 |
| Diol | CMA 3190 |  |  |  |  |  |  |  |
| Matting agent | CP4-8991 | 47.3 | 47.3 | 47.3 | 47.3 | 47.3 | 47.3 | 47.3 |
| Benzene ring-containing melamine resin | M-85 | 4.7 |  |  | 4.7 | 4.7 | 4.7 | 4.7 |
| Acid catalyst | CYCAT600 | 4.7 |  |  |  |  | 4.7 | 4.7 |
| PDI-based curing agent | D3725N |  |  |  |  |  |  |  |
| XDI-based curing agent | D120N |  |  | 132.2 |  | 132.2 |  | 132.2 |
| HDI-based curing agent | N3300 | 64.3 | 69.7 |  | 69.7 |  | 69.7 |  |
| Adhesion (initial state) | Peel Strength | 5 or less | 60-65 | 65-70 | 60-65 | 65-70 | 60-65 | 65-70 |
|  | Breaking of coating film | Yes | No | No | No | No | No | No |
|  | Coating film/PET peeling | Yes | No | No | No | No | No | No |
| Adhesion (after 48 hours of PCT) | Peel Strength | 5 or less | 5 or less | 5 or less | 5 or less | 5 or less | 5 or less | 5 or less |
|  | Breaking of coating film | Yes | Yes | Yes | Yes | Yes | Yes | Yes |
|  | Coating film/PET peeling | Yes | Yes | Yes | Yes | Yes | Yes | Yes |

EXPLANATION OF SYMBOLS

1: Solar cell
2: Sealant layer
3: Surface layer
4: Back sheet
5: Water-impermeable sheet
6: Cured coating film
7: Other coating film

The invention claimed is:

1. A composition, characterized in comprising:
a fluorine-containing polymer containing a curable functional group,
a pentamethylene diisocyanate-based curing agent,
a polyol compound selected from the group consisting of a polyol containing cyclohexane and a polyester polyol,
a benzene ring-containing melamine resin, and
an acid catalyst.

2. The composition according to claim 1, wherein the fluorine-containing polymer containing a curable functional group comprises a polymeric unit based on a fluorine-containing monomer and a polymeric unit based on a curable functional group-containing monomer, and the curable functional group-containing monomer is at least one selected from a group consisting of a hydroxyl group-containing monomer, a carboxyl group-containing monomer, an amino group-containing monomer and a silicone-based vinyl monomer.

3. The composition according to claim 2, wherein the fluorine-containing monomer is at least one selected from a group consisting of tetrafluoroethylene, chlorotrifluoroethylene, and vinylidene fluoride.

4. The composition according to claim 1, wherein the composition further comprises a pigment.

5. The composition according to claim 1, wherein the composition further comprises an ultraviolet absorbent.

6. The composition according to claim 1, wherein the composition is a coating.

7. A coating film, characterized in being obtained from the composition according to claim 1.

8. A laminate, characterized in comprising:
a substrate, and
a layer obtained from the composition according to claim 1.

9. The laminate according to claim 8, wherein the substrate is composed of a metal, a concrete, or a plastic.

10. A back sheet for a solar cell module, characterized in having:

a water-impermeable sheet; and
a coating film formed on at least one side of the water-impermeable sheet, the coating film being obtained from the composition according to claim 1.

11. A solar cell module, characterized in having:
a water-impermeable sheet;
a coating film formed on at least one side of the water-impermeable sheet, the coating film being obtained from the composition according to claim 1; and
a sealant layer formed above the coating film.

* * * * *